(12) United States Patent
Kovarik et al.

(10) Patent No.: US 7,253,541 B2
(45) Date of Patent: Aug. 7, 2007

(54) POWER HAND TOOL HAVING A PROXIMITY DETECTOR

(75) Inventors: Illya Kovarik, Chicago, IL (US); Martin Bartholet, Eschenbach (CH)

(73) Assignee: S-B Power Tool Corporation, Chicago, IL (US)

( * ) Notice: Subject to any disclaimer, the term of this patent is extended or adjusted under 35 U.S.C. 154(b) by 669 days.

(21) Appl. No.: 10/119,662

(22) Filed: Apr. 10, 2002

(65) Prior Publication Data

US 2003/0194283 A1    Oct. 16, 2003

(51) Int. Cl.
*H01H 35/00* (2006.01)
(52) U.S. Cl. .................................. 307/117; 307/326
(58) Field of Classification Search ............. 307/117, 307/326; 362/119; 408/4, 8
See application file for complete search history.

(56) References Cited

U.S. PATENT DOCUMENTS

| | | | |
|---|---|---|---|
| 3,641,410 A * | 2/1972 | Vogelsberg | 388/830 |
| 4,381,037 A | 4/1983 | Cuneo | |
| 4,410,846 A | 10/1983 | Gerber et al. | |
| 4,488,370 A | 12/1984 | Lemelson | |
| 4,604,005 A | 8/1986 | Russ | |
| 4,731,548 A * | 3/1988 | Ingraham | 307/116 |
| 4,942,313 A * | 7/1990 | Kinzel | 307/326 |
| 5,169,225 A * | 12/1992 | Palm | 362/118 |
| 5,340,972 A | 8/1994 | Sandor | |
| 5,489,891 A * | 2/1996 | Diong et al. | 340/567 |
| 5,576,531 A | 11/1996 | Murphy | |
| 5,583,386 A * | 12/1996 | Meixner et al. | 307/326 |
| 5,831,261 A | 11/1998 | Plesko | |
| 5,933,288 A | 8/1999 | Plesko | |
| 5,973,318 A | 10/1999 | Plesko | |
| 6,057,554 A | 5/2000 | Plesko | |
| 6,190,018 B1 * | 2/2001 | Parsons et al. | 362/116 |
| 6,202,930 B1 | 3/2001 | Plesko | |
| 6,206,538 B1 * | 3/2001 | Lemoine | 362/119 |
| 6,250,601 B1 | 6/2001 | Kolar et al. | |
| 6,262,712 B1 * | 7/2001 | Osborne et al. | 345/156 |
| 6,443,675 B1 * | 9/2002 | Kopras et al. | 409/182 |
| 6,517,295 B2 | 2/2003 | Lin | |
| 2003/0133239 A1 * | 7/2003 | Feil | 361/72 |

\* cited by examiner

*Primary Examiner*—Robert L. Deberadinis
(74) *Attorney, Agent, or Firm*—Greer, Burns & Crain, Ltd.

(57) ABSTRACT

The present invention provides a power tool with a hand proximity detector to detect the hand of an operator and a trigger circuit operable with the detector to control the operation of a light in the housing or to provide a safety lockout function.

21 Claims, 4 Drawing Sheets

POWER HAND TOOL HAVING A PROXIMITY DETECTOR

BACKGROUND OF THE INVENTION

This invention relates to power hand tools, and more specifically, to power hand tools that have a proximity detector that detects when an operator is in position to operate the tool and automatically illuminates a light or provides a safety function.

Power tools including relatively small portable handheld power tools are commonly used in a wide variety of locations and lighting conditions, including those where the available light may be poor for a variety of reasons. It is common to use a work light or a flashlight in such situations. However, it is often inconvenient to hold the light in the correct position at the same time one is using the hand tool. If there is no place to clamp or hang a light, the operator of the tool must then hold the tool and the light steady while attempting to utilize the tool. This is particularly inconvenient if the operator is atop a ladder or in a situation where one of his/her hands is needed for another purpose.

SUMMARY OF THE INVENTION

The present invention is directed to a power hand tool with an automatic hand proximity detector that preferably senses the presence of the hand and turns on a light to illuminate the work piece. The proximity detector can also be used as a safety interlock for de-energizing a portable power tool of the type which uses an on-off switch to activate it, such as a router, for example.

DETAILED DESCRIPTION OF THE DRAWINGS

DETAILED DESCRIPTION OF THE INVENTION

The preferred embodiment of the present invention is a portable power hand tool with a proximity detector disposed in the housing to sense the hand of an operator and turn on a light, preferably a light emitting diode, that is also disposed in the housing. A trigger circuit is located within the housing and is connected to the detector, the light and a power source. The trigger circuit also includes a switch for connecting the power source to the light when the detector detects the presence of the user's hand.

Figure 1:
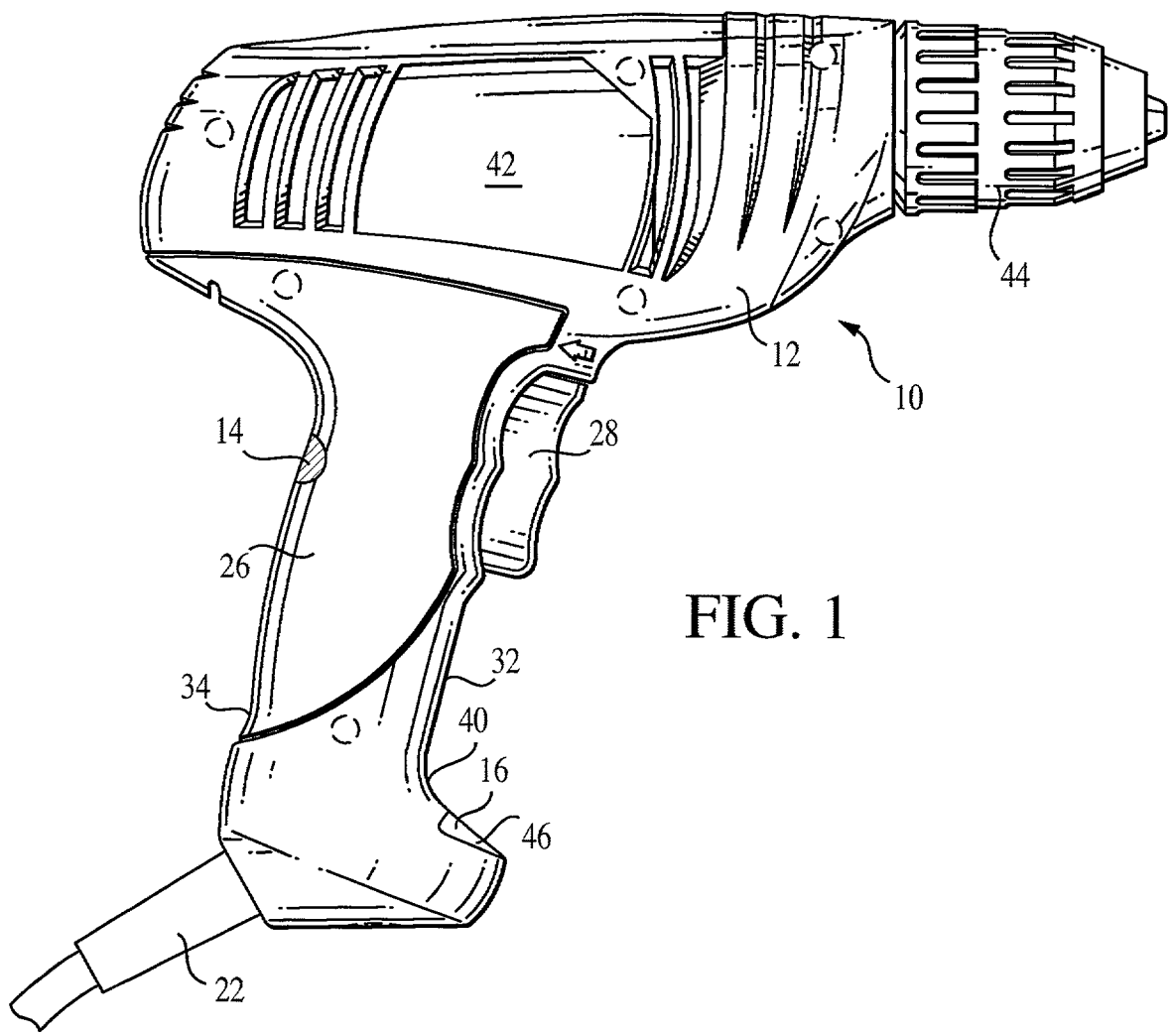
FIG. 1 is a side plan view of a tool embodiment of the present invention.
Figure 2:
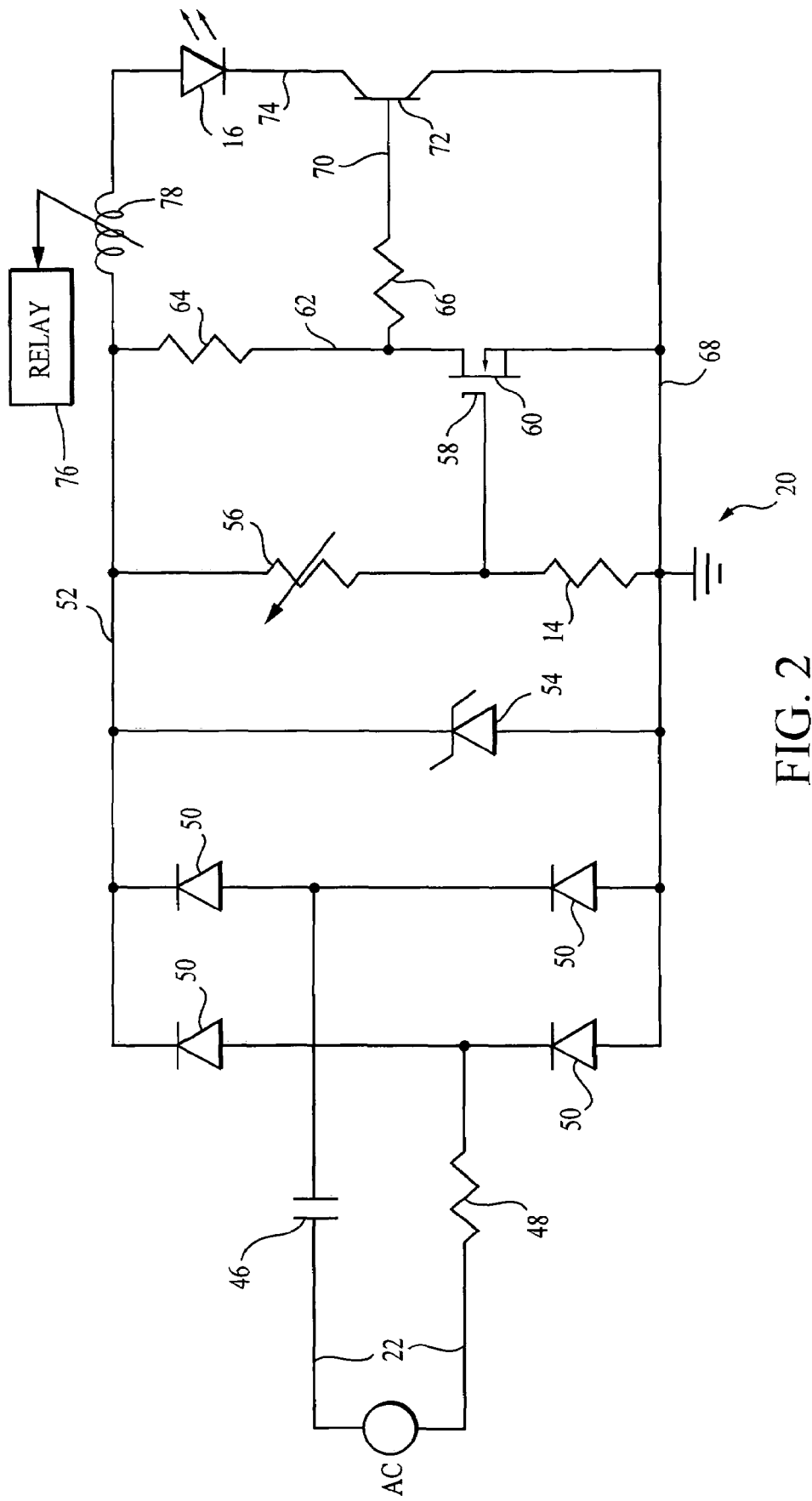
FIG. 2 is a schematic diagram of a trigger circuit for the tool of FIG. 1.

Turning now to the drawings and referring to FIG. 1, a hand-operated power drill, designated generally 10, is illustrated, but many other power hand tools are suitable for use with this invention, such as circular saws, screwdrivers, routers, and the like. The drill includes a housing 12 having a detector 14 and a light 16 disposed therein. A trigger circuit, designated generally at 20 in FIG. 2, is located within the housing and is connected to the detector 14, the light 16 and an AC power source via lines 22. When the operator picks up the drill 10 to use it in a normal manner, the detector 14 senses the user's hand causing the circuit 20 to turn on the light 16 and illuminate the work area. After normal use, when the operator sets down the drill 10 and removes his hand, the electrical response of the detector 14 causes the circuit 20 to cut off power to the light 16.

Many types of detectors 14 capable of sensing the proximity of the operator's hand can be used with the present invention. Preferred detectors 14 include a photocell or an infrared sensor, although a capacitance detector of the type which detects a change in frequency of a base signal due to the proximity of one's hand can be used. Alternatively, any detector that senses an inherent property of one's hand, such as its heat, resistance, capacitance, ability to block light, reflectance, magnetic properties and the like are within the spirit and scope of the present invention. Most preferably, consistent operation of the detector 14 should not depend on the use of work gloves or other coverings to protect the hand.

The detector 14 is located in the housing 12 and positioned to sense the user's hand during the normal operation of the drill 10. Generally, when the user grips a drill, the hand is wrapped around a handle portion 26, with the palm positioned against a side of the handle 26 and one or two fingers on a trigger 28 that controls the drill speed. The remaining fingers generally wrap around the front 32 of the handle 26, while the thumb and thumb pad wrap around the back 34 of the handle for stability. The preferred location for the detector 14 is in an area of the handle 26 that is covered by the hand of either a right or a left-handed user. Most preferably, the detector 14 is located on the front 32 of the handle 26, below the trigger 28, where the ring finger and the small finger wrap around the front 32 of the handle 26, or at the back 34 of the handle opposite the trigger, where the palm or the hand or the thumb pad wrap around the back 34 of the handle 26.

The light 16 is also disposed in the housing 12. Any type of small lamp 16 of a size suitable for use on the housing 12, including flashlight bulbs may be used in this invention, but the lights 16 are preferably light emitting diodes ("LEDs") due to their long life, small size and low power usage. In this regard, one or more high-intensity, white LEDs 16 are especially suitable for use with this invention as they produce large amounts of light. In the embodiment of FIG. 1, the light 16 is located in a lower portion 40 of the handle 26, but it may be located elsewhere on the housing 12 provided that it is capable of illuminating the workpiece. A lens 46 may be provided to concentrate the light in the vicinity of the work piece and/or to provide an esthetically pleasing appearance and also to provide protection for the LED.

Referring now to FIG. 2, the trigger circuit 20 controls the operation of the light 16 in response to the electrical signal from the detector 14 and is located within the housing 12, preferably in the handle 26 of the drill 10. The circuit is preferably powered from an AC power source via the cord 22, although it could be modified to be powered from a DC source such as an internal battery.

The characteristics of the electrical circuit change depending on the kind of the detector 14 that is employed. If the detector 14 is a photocell, resistance of the photocell 14 changes as it receives various amounts of light. Its resistance is high when the photocell 14 detects a dark condition (i.e., the presence of a hand over the detector), inhibiting flow of electricity through that portion of the circuit 20. However, when exposed to light, its resistance drops, which increases current flow.

The trigger circuit 20 electrically connects the detector 14, the light 16 and the power source to control power to the light 16 in response to the operation of the detector 14. The AC source is connected by line 22 to a capacitor 46 and a first resistor 48 which are in turn connected to an AC to DC converting rectifier bridge comprising four diodes 50 in circuit. The capacitor 46 acts a large AC resistance and the resistor 48 limits the initial current applied to the capacitor 46 and thereby protects the remaining circuitry from any power surges, including any initial power surge experienced when the drill 10 is first connected to the AC power source.

Since the circuit 20 operates in a constant current mode and preferably should not exceed a maximum voltage, the output of the bridge appears on line 52 and it is connected to a Zener diode 54 which reversibly breaks down when the voltage on line 52 exceeds a predetermined level. This occurs when the photocell 14 has a low resistance when it detects a bright light condition and the light 16 is turned off, thereby not using any current. When the photocell 14 detects a dark condition or hand being present, and results in the light 16 being illuminated by operation of the circuit 20, thereby drawing current, and the voltage applied to the Zener diode 54 drops below the breakdown value, and the Zener diode 54 stops current flow through it. The total constant current is in this manner shared between the light 16 and the Zener diode 54. The exact breakdown value of the Zener diode 54 is chosen depending on the type and voltage of the light 16 and other circuit considerations known to those of ordinary skill in the art. For a white LED 16, the Zener diode 54 is preferably of the common 5.1 volts breakdown type.

The trigger circuit 20 includes a resistor 56, which with the detector 14 creates a voltage divider to a gate 58 of a switching transistor 60. The transistor 60 is connected to line 62 that is connected to a resistors 64 and 66 and also to ground 68. The resistor 66 is connected to base 70 of a switching transistor 72 the emitter 74 of which is connected to the light and the collector of which is connected to ground 68. When the photocell 14 detects a bright light condition, its resistance is low and the transistor 60 is switched off which keeps the transistor 72 also in a non-conducting state. When the photocell detects a dark condition, the transistor 60 is switched on, which in turn causes the base of transistor 72 to go to a low voltage and place the transistor 72 into conduction which activates the light 16. Thus, the circuit 20 provides power from the power source to the light 16 when the detector 14 detects the presence of the operator's hand.

With regard to the circuit components, it has been found that a MOSFET transistor is suitable for transistor 60, with its drain 62 controlling the base 70 of a bipolar junction transistor 72. When the second conventional PNP transistor 72 is used, the light 16 tends to have a sharper transition between "on" and "off." Although this may be desirable in some circumstances, the use of the second bipolar transistor 72 in the circuit may be considered optional. It should be understood that the MOSFET 60 may be replaced by another type of electronic triggering component, such as a comparator, and is considered to be within the scope of the present invention.

Figure 3:
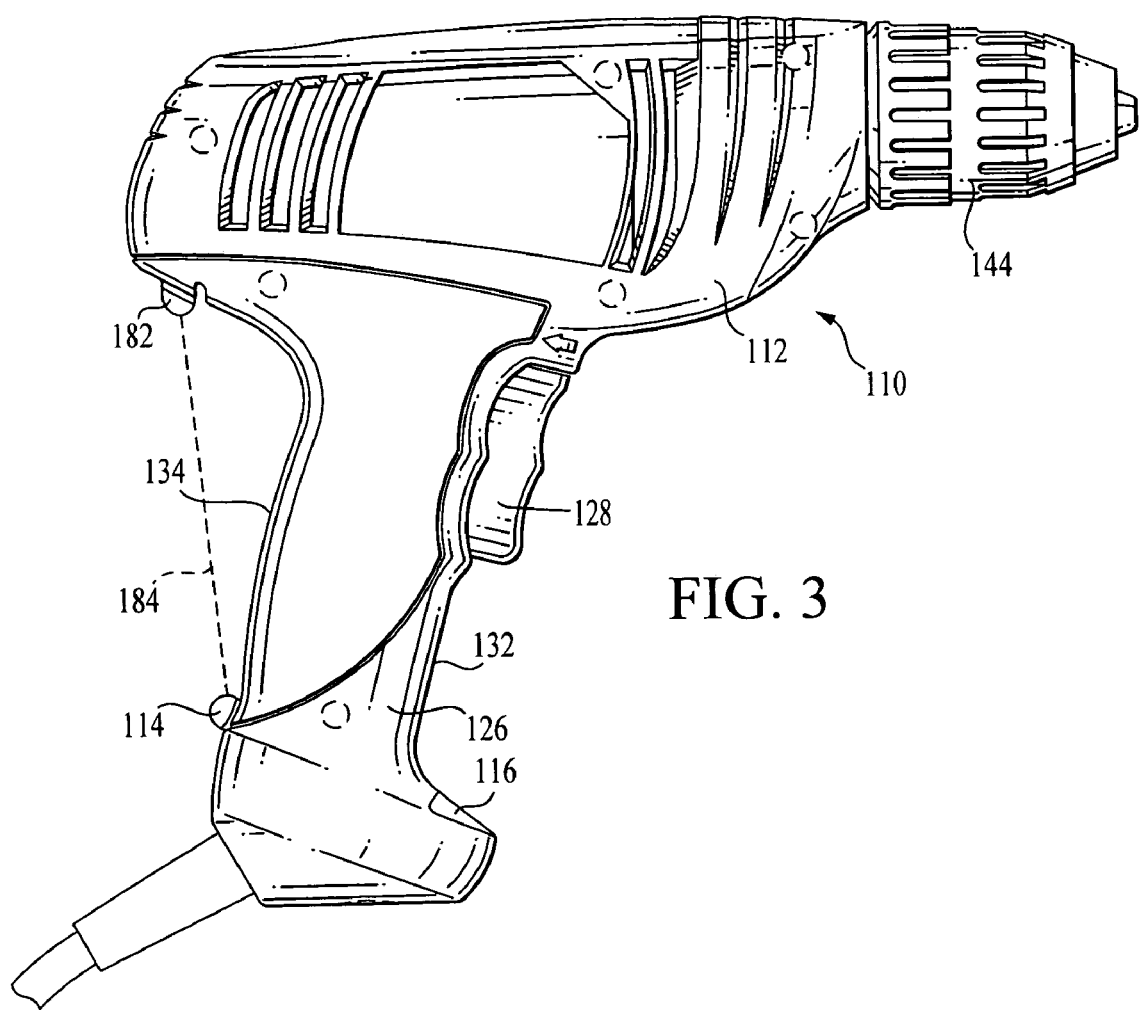
FIG. 3 is a side plan view of a second embodiment of the invention having an IR emitter; and, FIG. 4 is a schematic diagram of a preferred trigger circuit for the tool of FIG. 3.
Figure 4:
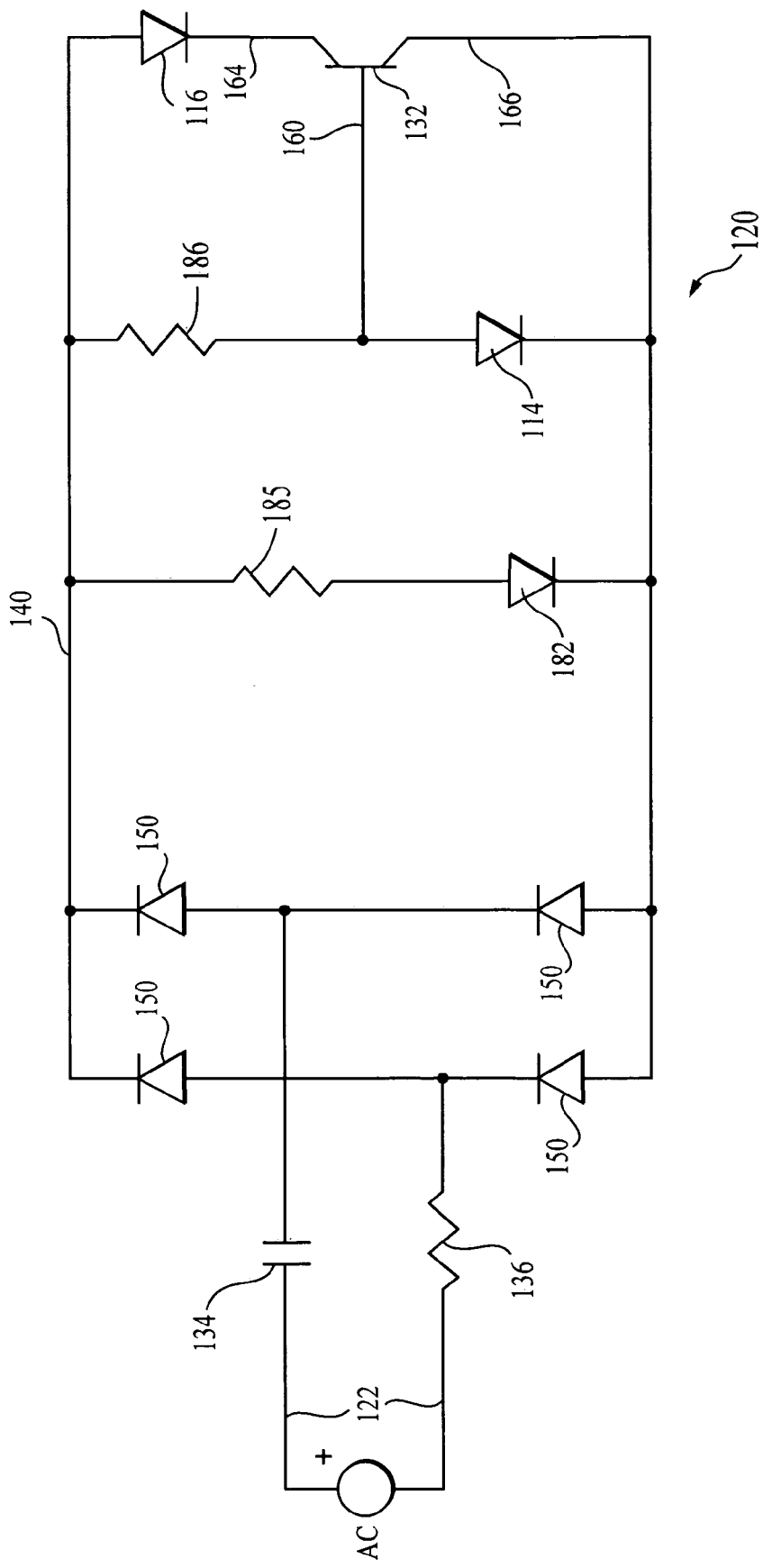

When the detector 14 is an infrared (IR) sensor, two types are optionally used. IR sensors 14 that detect the warmth of the hand are used in essentially the same manner as that shown in FIGS. 1 & 2. However, FIGS. 3 & 4 show a second embodiment 110 which require the presence of an IR emitter 182. In this embodiment, the drill 110 includes a housing 112 having a detector 114 and a light 116 disposed therein. and a handle 126. trigger switch 128 and chuck 144 are provided, as in the embodiment of FIG. 1. A trigger circuit, designated generally at 120 in FIG. 4, is located within the housing and is connected to the detector 114, the light 116 and an AC power source via lines 122. Lines 122 are connected via capacitor 134 and resistor 136 to a diode bridge comprised of diodes 150, similar to FIG. 2. The cathodes of the top two diodes 150 are connected to light 116 via line 140. and light 116 is connected by line 164 to the emitter of transistor 132. the collector of which is connected to around 166. Line 140 is connected to resistor 186 which is in turn connected to the base of transistor 132 and to detector 114 by line 160. The presence of the operator's hand is detected by interruption of an IR beam 184 between the emitter and a detector 114. The IR emitter 182 and the detector 114 are suitably placed anywhere on the housing 112 that causes interruption of the IR beam 184 when the hand is placed in the normal position to operate the tool 110. If the detector 114 is placed on the back 134 of the handle 126, the IR emitter 182 can be located on the housing at the back of the tool 110 as shown in FIG. 3. When the detector 114 is located on the front of the handle 126, a suitable location for the IR emitter 182 is on the front of the housing 112, near the chuck 144. The trigger circuit 120 is modified as shown in FIG. 4 to provide constant power to the IR emitter 182. A resistor 185 optionally adjusts the voltage to the IR emitter 182.

The trigger circuit 20 is also useful to terminate operation of the tool itself in conjunction with the light 16. This lockout functionality terminates power to the drill 10 if the operator' hand is not detected by the sensor 14, preventing uncontrolled operation of the tool if the drill 10 is dropped or the operator is incapacitated. Although the release of the trigger 26 should cease operation of the tool 14, the power lockout feature would serve as a backup safety feature if the trigger switch failed to cut power for any reason.

While many types of controlled switch component can be used, a relay is preferred. Referring to FIG. 2, a relay 76 that functions to interrupt power to the tool motor is preferably located in the housing and is controlled by a relay coil 78 that is in series with the light 16 so that it is activated and deactivated with the light 16 essentially simultaneously. While the coil 78 is in series as shown, it can be connected in parallel with the light 16, depending on the relative loads of each device. Normally, when the operator sets down the drill 10, there is no immediate need for either light or power until the tool is picked up again for the next use. Automatic deactivation of the light and power is not an inconvenience. However, in the case where the drill 10 is accidentally dropped, failure of the sensor 14 to detect the operator's hand automatically terminates power to the drill 10.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the following claims.

What is claimed is:

1. A hand tool having a motor powered by a power source and an operating switch for the motor controllable by an operator, comprising:
   a housing;
   a proximity detector disposed in said housing for detecting the presence of the operator independently of the operation of the hand tool motor;
   a light located in said housing; and,
   a trigger circuit located within said housing connected to said detector, said light and the power source, said circuit energizing said light when said detector detects the presence of the operator.

2. The tool as defined in claim 1 wherein said light is a light emitting diode.

3. The tool as defined in claim 1 wherein said proximity detector comprises a photocell.

4. The tool as defined in claim 3 wherein said detector is an infrared sensor.

5. The tool as defined in claim 4, further comprising an infrared emitter disposed in said housing.

6. The tool as defined in claim 1 wherein said housing further comprises a handle and said detector is disposed in said handle.

7. The tool as defined in claim 6 comprising a drill wherein said housing comprising a main portion with said handle being integral with said main portion and extending downwardly from said main portion, the drill having a chuck on the forward portion of the main portion of the housing, the operating switch being in the upper front portion of said handle, said light being located in the lower front portion of said handle.

8. The tool as defined in claim 7 wherein said proximity detector being located in the near of said handle.

9. The tool as defined in claim 1 wherein the power source is an AC source, said trigger circuit comprising:
 a converter for converting AC power and providing DC power at its output;
 said light connected to said converter output;
 a switch connected to said light and to ground;
 said detector being connected in said circuit and being operable to control said switch such that said switch is closed in response to said detector detecting the presence of the operator.

10. The tool as defined in claim 9 wherein said light is a light emitting diode having an anode connected to said converter and a cathode connected to said switch.

11. The tool as defined in claim 10 wherein said switch comprises a first transistor that has its control electrode operatively connected to said detector.

12. The tool as defined in claim 9 wherein said converter comprises a full wave diode bridge rectifier.

13. The tool as defined in claim 9 wherein said circuit further comprises a safety lockout operatively connected to the motor to disconnect power to the motor when said light is de-energized by said circuit.

14. The tool as defined in claim 13 wherein said safety lockout comprises a relay connected in circuit with the tool motor and having a relay coil connected in series with said light and operable to close circuit the relay when current is flowing through the coil.

15. The drill as defined in claim 14 wherein said circuit further comprises a safety lockout operatively connected to the drill motor to disconnect power to the motor when said light is de-energized by said circuit.

16. The drill as defined in claim 15 wherein said safety lockout comprises a relay connected in circuit with the tool motor and having a relay coil connected in series with said light and operable to close circuit the relay when current is flowing through the coil.

17. A hand tool having a motor powered by a power source and an operating switch for the motor controllable by an operator, comprising:
 a housing;
 a proximity detector disposed in said housing for detecting the presence of the operator during operation of the tool;
 a light located in said housing; and,
 a trigger circuit located within said housing connected to said detector, said light and the power source, said circuit energizing said light when said detector detects the presence of the operator;
 said trigger circuit comprising a converter for converting AC power and providing DC power at its output,
 said light is a light emitting diode having an anode connected to said converter and a cathode connected to said switch;
 said switch comprises a first transistor that has its control electrode operatively connected to said detector;
 a switch connected to said light and to ground;
 said detector being connected in said circuit and being operable to control said switch such that said switch is closed in response to said detector detecting the presence of the operator;
 said tool further comprising a Zener diode connected between the converter and ground, a second transistor connected in circuit between said control electrode of said first transistor and said detector, with the control electrode of said second transistor being connected to said detector and to a resistor, with said resistor being connected to said converter output and said detector also being connected to ground, said detector and resistor comprising a voltage divider that operates to provide a switching voltage to said second transistor when the internal resistance of said detector varies in response to detecting the presence and/or absence of an operator.

18. A portable handheld drill having a motor powered by a power source and an operating switch controllable by an operator for controlling the motor, the drill having a housing with a main portion and an integral handle extending downwardly from the main portion, the drill having a chuck at the front of the main portion of the housing, the operating switch being in the upper front portion of said handle, the drill comprising:
 a proximity detector that is separate from the operating switch, said detector being located in said housing and being configured to detect the presence of an operator that is in close proximity to the tool; and
 a trigger circuit located within said housing connected to said proximity detector, a light and the power source, said circuit energizing said light when said detector detects the presence of the operator; and
 said light being located in said housing.

19. The drill as defined in claim 18 wherein said proximity detector comprises an infrared emitter located at one of the rear of the main portion and the lower rear portion of the handle and an infrared sensor located at the other of the rear of the main portion and the lower rear portion of the handle, said infrared emitter and the infrared sensor being positioned so that said infrared sensor detects infrared emissions when the path between the infrared emitter and infrared detector is unobstructed.

20. The drill as defined in claim 18 wherein said proximity detector comprises a light source located at one of the rear of the main portion and the lower rear portion of the handle and a photocell located at the other of the rear of the main portion and the lower rear portion of the handle, said a light source and the photocell being positioned so that said photocell detects light from said light source when the path between the light source and photocell is unobstructed.

21. A portable handheld drill having a motor powered by a power source and an operating switch controllable by an operator for controlling the motor, the drill having a housing with a main portion and an integral handle extending downwardly from the main portion, the drill having a chuck at the front of the main portion of the housing, the operating switch being in the upper front portion of said handle, the drill comprising:
   a proximity detector separate from the operating switch disposed in the housing for detecting the presence of the operator's hand in close proximity to the tool;
   a light located in said housing; and,
   a trigger circuit located within said housing connected to said detector, said light and the power source, said circuit energizing said light when said detector detects the presence of the operator's hand.

* * * * *